United States Patent
Tsukaguchi et al.

(10) Patent No.: US 6,936,337 B2
(45) Date of Patent: *Aug. 30, 2005

(54) METAL/CERAMIC CIRCUIT BOARD

(75) Inventors: Nobuyoshi Tsukaguchi, Nagano (JP); Masami Kimura, Chiba (JP)

(73) Assignee: Dowa Mining Co., Ltd., Tokyo (JP)

( * ) Notice: Subject to any disclaimer, the term of this patent is extended or adjusted under 35 U.S.C. 154(b) by 40 days.

This patent is subject to a terminal disclaimer.

(21) Appl. No.: 10/713,390

(22) Filed: Nov. 14, 2003

(65) Prior Publication Data

US 2004/0131832 A1 Jul. 8, 2004

Related U.S. Application Data

(63) Continuation-in-part of application No. 10/254,724, filed on Sep. 25, 2002, now Pat. No. 6,686,030.

(30) Foreign Application Priority Data

Sep. 28, 2001 (JP) ..................................... P2001-304513

(51) Int. Cl.[7] ................................................. H05K 1/02
(52) U.S. Cl. ....................... 428/210; 428/209; 428/469; 428/627
(58) Field of Search .................................. 428/210, 209

(56) References Cited

U.S. PATENT DOCUMENTS

| 6,284,985 B1 | 9/2001 | Naba et al. |
| 6,686,030 B2 * | 2/2004 | Tsukaguchi et al. ........ 428/210 |

FOREIGN PATENT DOCUMENTS

| DE | 44 06 397 | 8/1995 |
| EP | 0 827 198 | 3/1998 |
| EP | 0 935 286 | 8/1999 |
| JP | 10-326949 | 12/1998 |
| JP | 11322455 | 11/1999 |

* cited by examiner

Primary Examiner—Cathy F. Lam
(74) Attorney, Agent, or Firm—Bachman & LaPointe, P.C.

(57) ABSTRACT

There is provided a metal/ceramic circuit board capable of eliminating discrepancy during mounting of parts to improve the reliability of mounting of the parts. The metal/ceramic circuit board has a ceramic substrate 10, and a metal circuit plate (a copper plate 14) bonded to the ceramic substrate 10, the metal circuit plate having a thickness which is more than 0.25 mm and which is less than 0.3 mm, and the metal circuit plate having a skirt spreading length (a dimensional difference between the bottom and top portion of the peripheral edge portion of the metal circuit plate) of less than 50 μm.

11 Claims, 7 Drawing Sheets

METAL/CERAMIC CIRCUIT BOARD

This is a continuation-in-part (C-I-P) application of U.S. patent application Ser. No. 10/254,724 filed on Sep. 25, 2002 which issued as U.S. Pat. No. 6,686,030 on Feb. 3, 2004.

BACKGROUND OF THE INVENTION

1. Field of the Invention

The present invention generally relates to a metal/ceramic circuit board having a ceramic substrate and a metal circuit plate which is formed on the ceramic substrate directly or via a brazing filler metal or the like. More specifically, the invention relates to a metal/ceramic circuit board on which parts, such as semiconductor parts, are mounted and which is used for a power module or a Peltier element module.

2. Description of the Prior Art

In a typical method for producing a ceramic circuit board for a power module or for mounting a semiconductor thereon, a metal plate and a ceramic substrate are first bonded to each other. For example, there is industrially utilized the direct bonding method for arranging a copper plate on a ceramic substrate so as to allow the copper plate to directly contact the ceramic substrate and for heating the copper plate and the ceramic substrate in an inert gas to bond the ceramic substrate and the copper plate to each other. There is also industrially utilized the brazing and soldering method for arranging a copper plate on a ceramic substrate via a brazing filler metal containing an active metal, such as Ti, Zr or Hf, and for heating them in a vacuum to bond the ceramic substrate and the copper plate to each other. In the brazing and soldering method, the active metal concerns the bonding of the ceramic substrate to the metal plate, and the ceramic substrate reacts with the brazing filler metal to form a reaction product.

In circuit boards for power boards, the minimum distance between patterns is generally about 0.5 mm, and it is required to ensure a certain withstand voltage. On the other hand, in circuit boards for Peltier elements and high frequency circuits, it is required to form finer patterns. Therefore, the above described metal plate bonding method is not suitable for the production of such circuit boards, so that a metal film is formed on a ceramic substrate by plating or spattering.

In general, in a case where patterns are formed in a metal/ceramic circuit board by etching, the dimensional difference between the bottom and top faces of the peripheral edge portion of a metal circuit plate is about 50% of the thickness of the metal circuit plate. This difference is the distance between a plane perpendicular to the principal plane of a metal plate at one end of the bottom face of the metal plate and a plane perpendicular to the principal plane of the metal plate at one end of the top face of the metal plate on the same side as the one end of the bottom face of the metal plate, i.e., the length shown by L1 in FIG. 6. It is assumed that the sign of the distance is positive (+) when the area of the bottom face is greater than the area of the top face. This distance will be hereinafter referred to as a "skirt spreading length". Furthermore, in FIG. 6, L2 denotes a "brazing filler metal protruding length". For example, in a printed circuit board wherein a copper foil having a thickness of about 10 to 30 $\mu$m is applied on a resin substrate, such as a glass epoxy substrate, to form a circuit, or in a circuit board wherein a metal thin film having a thickness of several micrometers is formed on a ceramic substrate by spattering or plating to form a circuit, the skirt spreading lengths are over ten micrometers and several micrometers, respectively. Such dimensional differences do not influence the formation of the circuit and precision. On the other hand, in a substrate where a metal plate is bonded to a ceramic substrate directly or via a brazing filler metal, the metal plate usually has a relatively large thickness of about 100 to 500 $\mu$m, and the skirt spreading length of the metal circuit plate is at least in the range of from about 50 $\mu$m to about 250 $\mu$m. Such a dimensional difference can not ignore in order to form a fine circuit.

In addition, although the skirt spreading length of a metal circuit plate in a conventional metal/ceramic substrate is generally in the range of from about 50 $\mu$m to about 200 $\mu$m, there has been proposed a metal/ceramic circuit board wherein the skirt spreading length of a metal circuit plate is in the range of from 50 $\mu$m to 100 $\mu$m (see Japanese Patent Laid-Open No. 10-326949).

However, the demands for compactization in recent years are also made in the field of module. If the area for mounting parts, such as Si chips, is small, the parts are often displaced during the mounting of the parts to protrude part of the parts from the substrate. If this protrusion is extremely large, the parts are displaced to adjacent metal circuit patterns, so that the circuit can not be formed.

In addition, the parts are mounted using a solder paste or the like. If the semiconductor mounting design area (the area of the top of the metal plate) is small, even if the amount of the paste slightly decreases, the possibility of producing voids increases.

Moreover, the discrepancy in mounting of these parts decreases the effective heat transfer area of parts, such as an area below a chip, in a substrate similar to a power module. Therefore, there are some cases where heat dissipation decreases to accumulate heat in the circuit to promote the deterioration of reliability. For example, if a 11×11 mm part is displaced by 0.1 mm in horizontal (x, y) directions in the mounting portion to protrude, respectively, the effective heat transfer area decreases by about 2%, and if a 0.8×1.8 mm part is displace by 0.1 mm in horizontal (x, y) directions in the mounting portion to protrude, respectively, the effective heat transfer area decreases by about 17%. These values are very large values with respect to the radiation design of the substrate. Moreover, if voids are also produced, circumstances have a tendency to further deteriorate. For that reason, the requirements for dimension for mounting parts on the substrate, and the requirements for improvement of costs of defectives are very severe in the circumstance.

SUMMARY OF THE INVENTION

It is therefore an object of the present invention to eliminate the aforementioned problems and to provide a metal/ceramic circuit board capable of eliminating discrepancy during mounting of parts to improve the reliability of mounting of the parts.

In order to accomplish the aforementioned and other objects, the inventors have diligently studied and found that it is possible to decrease the skirt spreading length of a metal circuit board in comparison with that of a conventional metal circuit board, to increase the area of a circuit pattern, i.e., a part mounting area, to improve the reliability of mounting of parts, by studying etching conditions for the metal circuit plate.

According to one aspect of the present invention, there is provided a metal/ceramic circuit board comprising: a ceramic substrate; and a metal circuit plate arranged on the ceramic substrate, the metal circuit plate having a thickness which is more than 0.25 mm and which is less than 0.3 mm, and the metal circuit plate having a skirt spreading length of less than 50 µm, the skirt spreading length being a distance between a plane perpendicular to a principal plane of the metal plate at one end of a bottom face of the metal plate and a plane perpendicular to a principal plane of the metal plate at one end of a top face of the metal plate on the same side as the one end of the bottom face of the metal plate assuming that the distance is positive when the bottom face has a greater area than that of the top face.

In this metal/ceramic circuit board, the metal circuit plate may be bonded directly to the ceramic substrate. In this case, the metal circuit plate is preferably treated by nickel plating, nickel alloy plating, gold plating or preservation.

In the above described metal/ceramic circuit board, the metal circuit plate may be bonded to the ceramic substrate via a brazing filler metal. In this case, the brazing filler metal is preferably made of a material selected from the group consisting of alloys and compounds containing Ag and an active metal, alloys and compounds containing Al, and mixtures thereof. In addition, the metal circuit plate and the brazing filler metal are preferably treated by nickel plating, nickel alloy plating, gold plating or preservation.

In the above described metal/ceramic circuit board, the ceramic substrate is preferably formed of a material selected from the group consisting of oxides, nitrides and carbides. In addition, the metal circuit plate is preferably formed of a material selected from the group consisting of copper, aluminum, and alloys thereof.

Moreover, the above described metal/ceramic circuit board is preferably a metal/ceramic circuit board on which a super power element is mounted, or a metal/ceramic circuit board having a fine pattern on which a Peltier element or a high frequency circuit is mounted.

According to another aspect to the present invention, a module is assembled by using the above described metal/ceramic circuit board.

BRIEF DESCRIPTION OF THE DRAWINGS

The present invention will be understood more fully from the detailed description given here below and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Figure 1A:
FIGS. 1A through 1C are sectional views showing steps of producing a metal/ceramic circuit board according to the present invention.

Referring now to the accompanying drawings, the preferred embodiment of a metal/ceramic circuit board according to the present invention will be described below.

The preferred embodiment of a metal/ceramic circuit board according to the present invention is produced by using the direct bonding method for arranging a metal plate on a ceramic substrate so as to allow the metal plate to directly contact the ceramic substrate and for heating the metal plate and the ceramic substrate in an inert gas to bond the ceramic substrate and the metal plate to each other, or by using the brazing and soldering method for arranging a metal plate on a ceramic substrate via a brazing filler metal containing an active metal, such as Ti, Zr or Hf, to heat them in a vacuum to bond the ceramic substrate and the metal plate to each other. These methods are preferred when the metal plate is a copper metal. In addition, a method for brazing and soldering a metal plate to a ceramic substrate via Al—Si or Al—Si—Ti brazing filler metals containing Al, or a method for bonding a metal plate directly to a ceramic substrate by the molten metal bonding method may be used. These methods are preferred when the metal plate is an Al plate.

In order to pattern a metal plate, such as a copper plate, which is bonded to a ceramic substrate for a circuit or radiating plate, in a predetermined shape, an etching resist is applied on the surface of the metal plate in a pattern shape (or the surface of the metal plate is masked with an etching resist in a pattern shape), to etch the metal plate in a predetermined pattern. Alternatively, a method for bonding a metal plate to a ceramic substrate after forming a metal plate having a predetermined pattern shape by press working or etching may be used. The etching method is preferred in view of the dimensional precision or positional precision of the pattern. However, the above described methods may be chosen in view of the required precision and costs.

As an etchant for the metal plate, a mixed solution of iron chloride or copper chloride and hydrochloric acid and aqueous hydrogen peroxide may be used. In the case of the above described direct bonding method for copper, reaction products can be ignored, so that the copper plate can be etched to form a pattern without causing problems. However, in the case of the brazing and soldering method or the like, the brazing filler metal remains, so that it is required to remove the brazing filler metal with other chemicals.

When a circuit is formed by etching, the skirt spreading length is set to be less than 50 µm by optimizing etching conditions and the design of the dimension of the mask used for etching. When a metal plate having a predetermined pattern shape is bonded to a ceramic substrate, it is required to control the skirt spreading length in the metal plate working stage, and it is required to optimize the skirt spreading length in view of thermal expansion and contraction caused by overheating and supercooling due to bonding.

On the metal circuit plate of the metal/ceramic circuit board patterned by such processes, Ni plating or Ni alloy plating is carried out if necessary.

Moreover, chip parts, such as semiconductor parts, are mounted thereon by soldering or the like, to be used as a power module, a Peltier element or a high frequency circuit board.

Referring to the accompanying drawing, examples of a metal/ceramic circuit board according to the present invention will be described below in detail.

EXAMPLE 1

The weight of metal powder containing metal components was measured so that the components are 91 Ag-7 Cu-1.5 Ti-0.5 $TiO_2$ (wt %). To this metal powder, about 10% of an acrylic vehicle was added. By kneading this mixture by an automatic mortar and three roll mills by a usual method, a paste-like brazing filler metal was prepared.

Figure 1B:
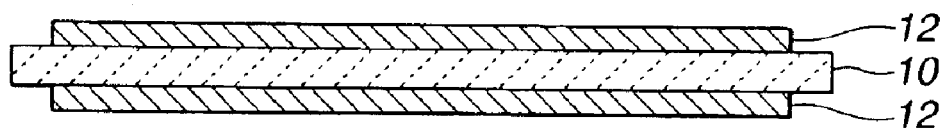
Figure 1C:
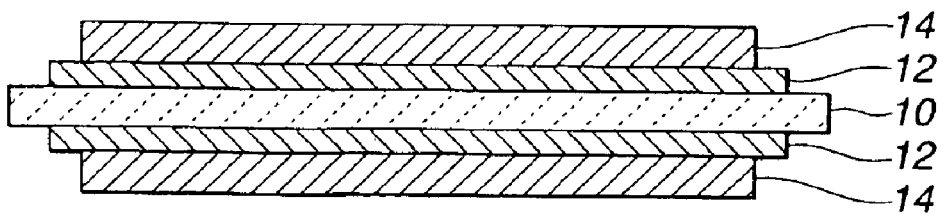

Then, as shown in FIGS. 1A through 1C, a ceramic substrate 10 was prepared (FIG. 1A), and the brazing filler metal 12 was applied on both faces of the ceramic substrate 10 by the screen printing (FIG. 1B). Then, copper plates 14 having a thickness of 0.25 mm were arranged on both side thereof, and the copper plates 14 were bonded to the ceramic substrate 10 at 835° C. in a vacuum furnace. In order to verify the thickness of the brazing filler metal 12, the sample thus bonded was cut to measure the thickness of the brazing filler metal 12. As a result, the thickness of the brazing filler metal 12 was about 20 μm. As the ceramic substrate 10, an S grade AlN substrate produced by ATG company was used.

Figure 2A:
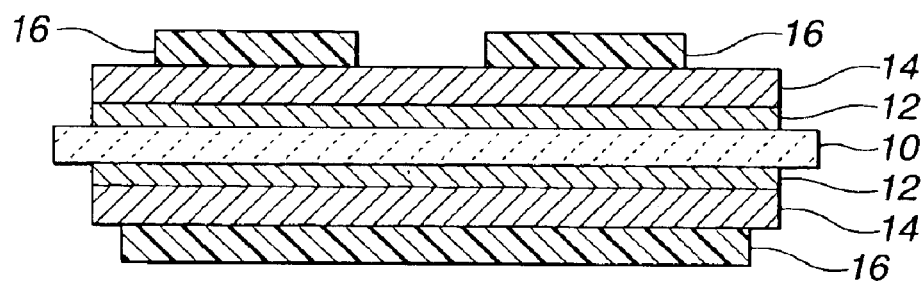
FIGS. 2A through 2C are sectional views showing steps of producing a metal/ceramic circuit board according to the present invention.
Figure 2B:
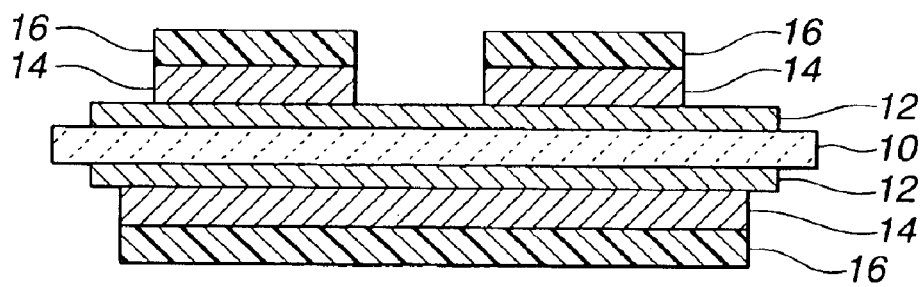
Figure 2C:
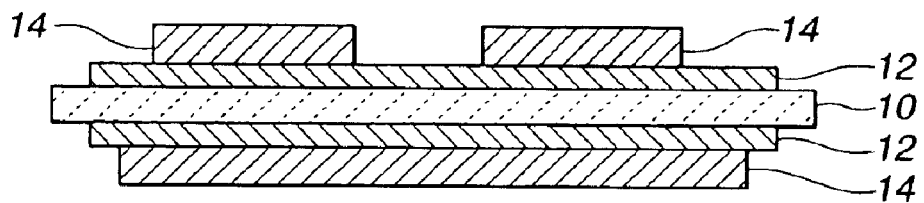

Thereafter, the sample thus bonded was taken out of the vacuum furnace. Then, as shown in FIGS. 2A through 2C, ultraviolet curing alkali peeling resists 16 having a desired circuit pattern and a thickness of 10 to 15 μm were applied on both faces of the bonded copper plates 14 (FIG. 2A), and undesired portions of the copper plates 14 were removed with an etchant comprising copper chloride, aqueous hydrogen peroxide and hydrochloric acid (FIG. 2B). Thereafter, the resists 16 were removed with an aqueous solution of 3.5% sodium hydroxide (FIG. 2C).

Figure 3A:
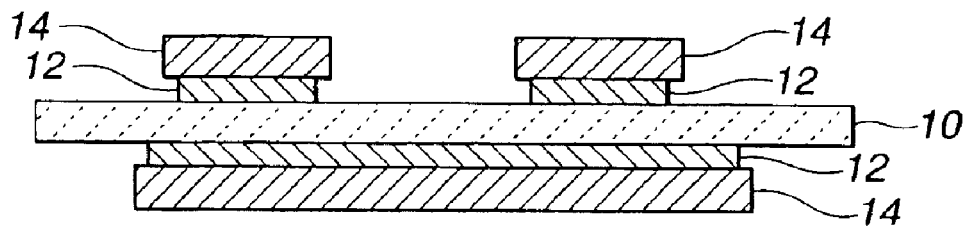
FIGS. 3A through 3C are sectional views showing steps of producing a metal/ceramic circuit board according to the present invention.
Figure 3B:
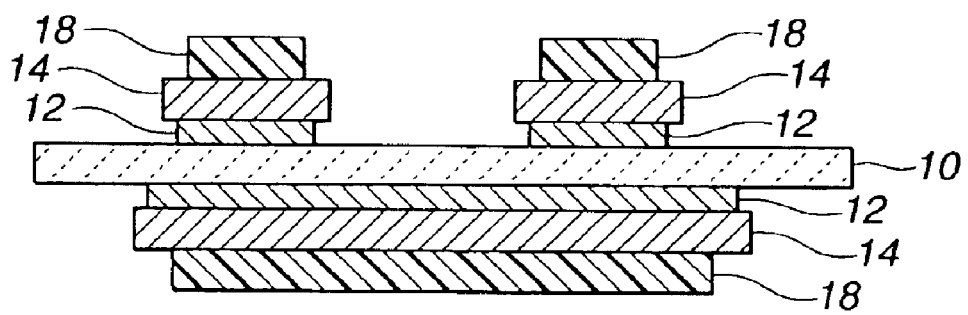
Figure 3C:
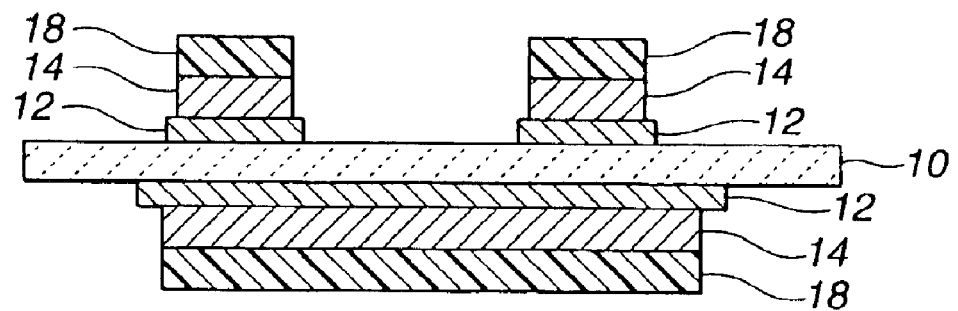
Figure 4A:
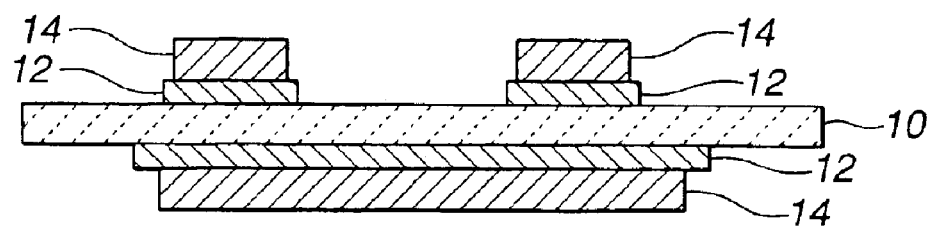
FIGS. 4A and 4B are sectional views showing steps of producing a metal/ceramic circuit board according to the present invention.
Figure 4B:
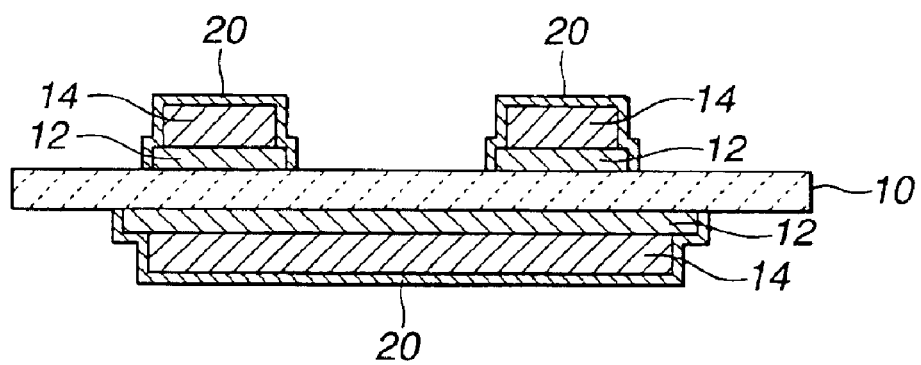

Then, in order to remove undesired portions of the brazing filler metal between circuit patterns and on the edge faces of the substrate, the sample was dipped in a mixed solution containing 1.4% EDTA, 6% hydrogen peroxide and 3% ammonia to remove undesired portions of the brazing filler metal 12 (FIG. 3A). At this time, the design value of a chip mounting portion was 11 mm×11 mm (the bottom face of the copper plate). Thereafter, ultraviolet curing alkali peeling resists 18 having a desired circuit pattern were applied on both faces of the copper plates 14 again (FIG. 3B), and the copper plates 14 were dipped in a chemical polishing solution so that the dimensional difference (skirt spreading length) between the top and bottom portions of the peripheral portion of each of the copper plates 14 is 20μm (FIG. 3C). Thereafter, the resists 18 were removed with an aqueous solution of 3.5% sodium hydroxide (FIG. 4A), and an Ni—P electroless plating 20 was carried out (FIG. 4B) after chemical-polishing the copper plates 14.

On the chip mounting portion of the metal circuit plate thus prepared, a semiconductor chip was mounted via a high temperature solder, and the presence of displacement of the chip was verified. As a result, twenty samples had no displacement of the chip.

EXAMPLE 2

The weight of metal powder containing metal components was measured so that the components are 91 Ag-7 Cu-1.5 Ti-0.5 $TiO_2$ (wt %). To this metal powder, about 10% of an acrylic vehicle was added. By kneading this mixture by an automatic mortar and three roll mills by a usual method, a paste-like brazing filler metal was prepared.

Then, as shown in FIGS. 1A through 1C, a ceramic substrate 10 was prepared (FIG. 1A), and the brazing filler metal 12 was applied on both faces of the ceramic substrate 10 by the screen printing (FIG. 1B). Then, copper plates 14 having a thickness of 0.25 mm were arranged on both side thereof, and the copper plates 14 were bonded to the ceramic substrate 10 at 835° C. in a vacuum furnace. In order to verify the thickness of the brazing filler metal 12, the sample thus bonded was cut to measure the thickness of the brazing filler metal 12. As a result, the thickness of the brazing filler metal 12 was about 20 μm. As the ceramic substrate 10, an S grade AlN substrate produced by ATG company was used.

Thereafter, the sample thus bonded was taken out of the vacuum furnace. Then, as shown in FIGS. 2A through 2C, ultraviolet curing alkali peeling resists 16 having a desired circuit pattern and a thickness of 10 to 15 μm were applied on both faces of the bonded copper plates 14 (FIG. 2A), and undesired portions of the copper plates 14 were removed with an etchant comprising copper chloride, aqueous hydrogen peroxide and hydrochloric acid (FIG. 2B). Thereafter, the resists 16 were removed with an aqueous solution of 3.5% sodium hydroxide (FIG. 2C). In the etching at this time, larger masks than usual masks by 50 μm were used as the resists 16 in view of correction carried out by etching, and conditions, such as the conveyer speed of the etching machine and the spray pressure of the etchant, were controlled so as to provide a difference of 20 μm or less between the top and bottom portions of the copper plate and so as to meet the dimensional precision. At this time, the design value of a chip mounting portion was 11 mm×11 mm (the bottom face of the copper plate).

Figure 5:
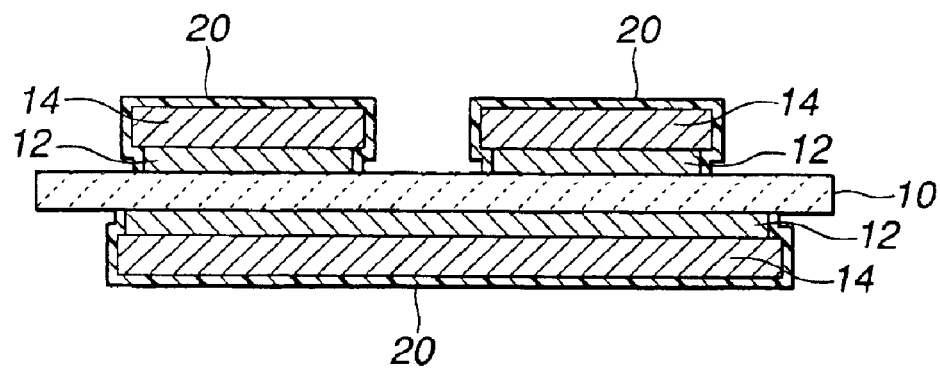
FIG. 5 is a sectional view showing a step of producing a metal/ceramic circuit board according to the present invention.
Figure 6:
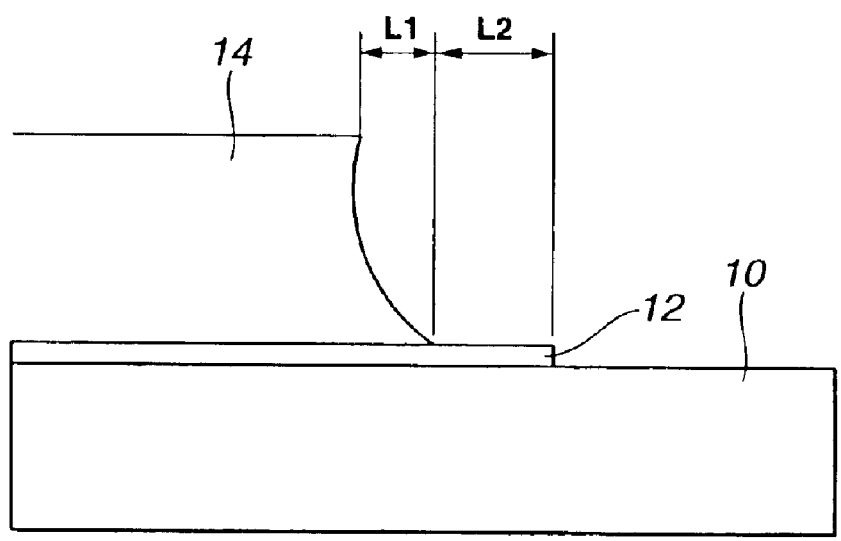
FIG. 6 is a schematic view for explaining a skirt spreading length.

Then, in order to remove undesired portions of the brazing filler metal between circuit patterns and on the edge faces of the substrate, the sample was dipped in a mixed solution containing 1.4% EDTA, 6% hydrogen peroxide and 3% ammonia to remove undesired portions of the brazing filler metal 12 (FIG. 3A). Thereafter, an Ni—P electroless plating 20 was carried out on the surfaces of the copper plates 14 and brazing filler metal 12 (FIG. 5).

On the chip mounting portion of the metal circuit plate thus prepared, a semiconductor chip was mounted via a high temperature solder, and the presence of displacement of the chip was verified. As a result, twenty samples had no displacement of the chip.

EXAMPLE 3

Samples were prepared by the same method as that in Example 2, except that the thickness of the copper plate was 0.2 mm and the dimension of the chip mounting portion was 0.8 mm×1.8 mm.

On the chip mounting portion of the metal circuit plate thus prepared, a chip was mounted via a high temperature solder, and the presence of displacement of the chip was verified. As a result, 320 samples had no displacement of the chip.

COMPARATIVE EXAMPLE 1

Samples were prepared by the same method as that in Example 2, except that the skirt spreading length was 100 μm. Furthermore, the ratio of the area of the top face of the metal plate of the sample prepared in each of Examples 1 and 2 to the area of the top face of the metal plate of the sample prepared in this comparative example is 103%.

On the chip mounting portion of the metal circuit plate thus prepared, a chip was mounted via a high temperature solder, and the presence of displacement of the chip was verified. As a result, two of thirty samples had displacement of the chip.

COMPARATIVE EXAMPLE 2

Samples were prepared by the same method as that in Example 3, except that the skirt spreading length was 100 μm. Furthermore, the ratio of the area of the top face of the metal plate of the sample prepared in Example 3 to the area of the top face of the metal plate of the sample prepared in this comparative example is 139%.

On the chip mounting portion of the metal circuit plate thus prepared, a chip was mounted via a high temperature solder, and the presence of displacement of the chip was verified. As a result, thirty of 320 samples had displacement of the chip.

EXAMPLE 4

Samples were prepared by the same method as that in Example 1, except that the thickness of the copper plate was 0.26 mm.

On the chip mounting portion of the metal circuit plate thus prepared, a chip was mounted via a high temperature solder, and the presence of displacement of the chip was verified. As a result, twenty samples had no displacement of the chip.

EXAMPLE 5

Samples were prepared by the same method as that in Example 1, except that the thickness of the copper plate was 0.27 mm.

On the chip mounting portion of the metal circuit plate thus prepared, a chip was mounted via a high temperature solder, and the presence of displacement of the chip was verified. As a result, twenty samples had no displacement of the chip.

EXAMPLE 6

Samples were prepared by the same method as that in Example 1, except that the thickness of the copper plate was 0.29 mm.

On the chip mounting portion of the metal circuit plate thus prepared, a chip was mounted via a high temperature solder, and the presence of displacement of the chip was verified. As a result, twenty samples had no displacement of the chip.

EXAMPLE 7

Samples were prepared by the same method as that in Example 2, except that the thickness of the copper plate was 0.26 mm.

On the chip mounting portion of the metal circuit plate thus prepared, a chip was mounted via a high temperature solder, and the presence of displacement of the chip was verified. As a result, twenty samples had no displacement of the chip.

EXAMPLE 8

Samples were prepared by the same method as that in Example 2, except that the thickness of the copper plate was 0.27 mm.

On the chip mounting portion of the metal circuit plate thus prepared, a chip was mounted via a high temperature solder, and the presence of displacement of the chip was verified. As a result, twenty samples had no displacement of the chip.

EXAMPLE 9

Samples were prepared by the same method as that in Example 2, except that the thickness of the copper plate was 0.29 mm.

On the chip mounting portion of the metal circuit plate thus prepared, a chip was mounted via a high temperature solder, and the presence of displacement of the chip was verified. As a result, twenty samples had no displacement of the chip.

EXAMPLE 10

Figure 7A:
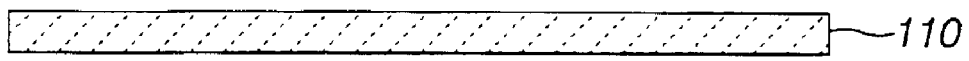
FIGS. 7A through 7C are sectional views showing steps of producing a metal/ceramic circuit board according to the present invention.
Figure 7B:
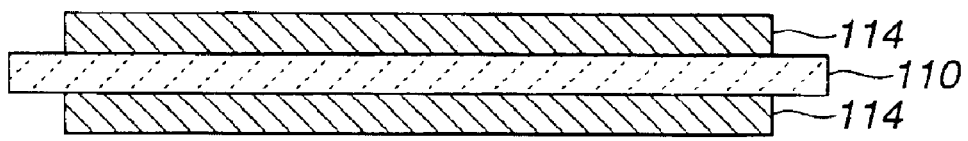

As shown in FIGS. 7A and 7B, a ceramic substrate 110 was prepared (FIG. 7A), and copper plates 114 having a thickness of 0.2 mm were arranged on both side thereof to be heated in an inert gas to be bonded directly to the ceramic substrate 110 by the direct bonding method (FIG. 7B).

Figure 7C:
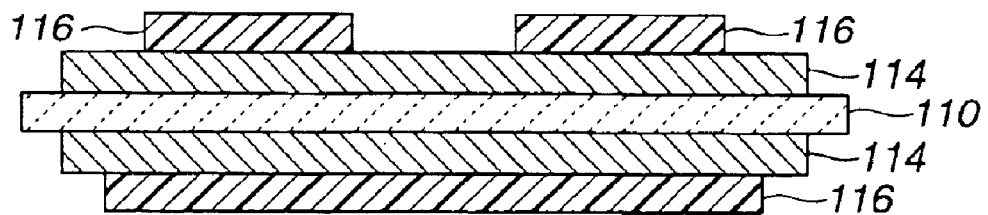
Figure 8A:
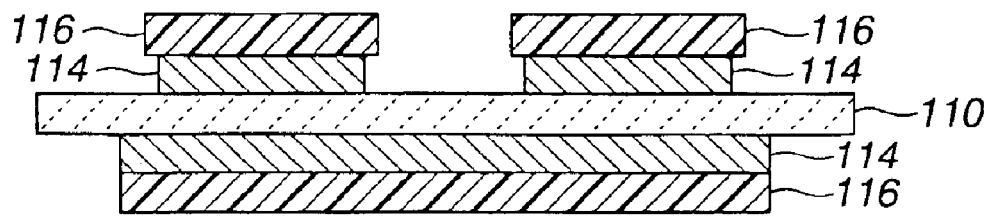
FIGS. 8A through 8C are sectional views showing steps of producing a metal/ceramic circuit board according to the present invention.
Figure 8B:
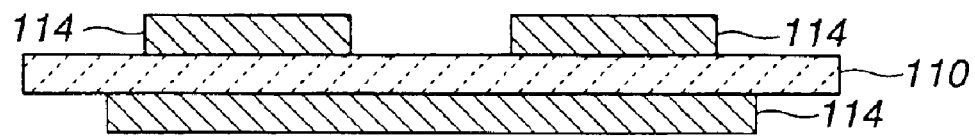

Thereafter, the article thus bonded was cooled. Then, as shown in FIGS. 7C and 8A, ultraviolet curing alkali peeling resists 116 having a desired circuit pattern and a thickness of about 10 to 15 μm were applied on both faces of the bonded copper plates 114 (FIG. 7C), and undesired portions of the copper plates 114 were removed with an etchant comprising copper chloride, aqueous hydrogen peroxide and hydrochloric acid (FIG. 8A). Thereafter, as shown in FIG. 8B, the resists 116 were removed with an aqueous solution of 3.5% sodium hydroxide. In the etching at this time, larger masks than usual masks by 50 μm were used as the resists 116 in view of correction carried out by etching, and conditions, such as the conveyer speed of the etching machine and the spray pressure of the etchant, were controlled so as to provide a difference of 20 μm or less between the top and bottom portions of the copper plate and so as to meet the dimensional precision. At this time, the design value of a chip mounting portion was 11 mm×11 mm (the bottom face of the copper plate).

Figure 8C:
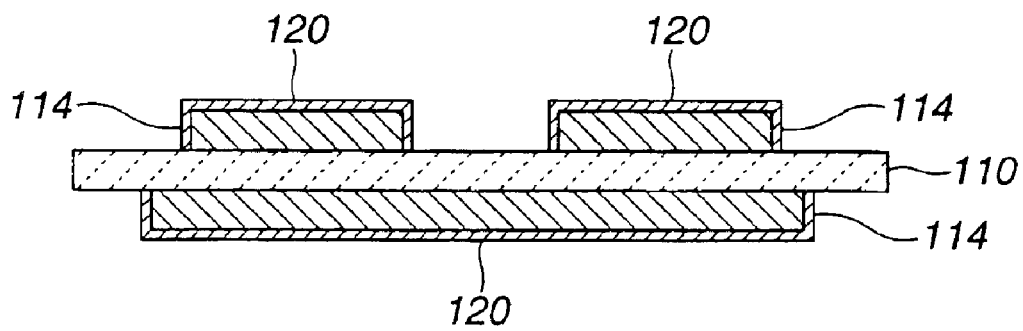

Thereafter, as shown in FIG. 8C, an Ni—P electroless plating 120 was carried out on the surfaces of the copper plates 114.

On the chip mounting portion of the metal circuit plate thus prepared, a semiconductor chip was mounted via a high temperature solder, and the presence of displacement of the chip was verified. As a result, twenty samples had no displacement of the chip.

EXAMPLE 11

Samples were prepared by the same method as that in Example 10, except that the thickness of the copper plate was 0.25 mm.

On the chip mounting portion of the metal circuit plate thus prepared, a chip was mounted via a high temperature solder, and the presence of displacement of the chip was verified. As a result, twenty samples had no displacement of the chip.

EXAMPLE 12

Samples were prepared by the same method as that in Example 10, except that the thickness of the copper plate was 0.26 mm.

On the chip mounting portion of the metal circuit plate thus prepared, a chip was mounted via a high temperature solder, and the presence of displacement of the chip was verified. As a result, twenty samples had no displacement of the chip.

EXAMPLE 13

Samples were prepared by the same method as that in Example 10, except that the thickness of the copper plate was 0.27 mm.

On the chip mounting portion of the metal circuit plate thus prepared, a chip was mounted via a high temperature solder, and the presence of displacement of the chip was verified. As a result, twenty samples had no displacement of the chip.

EXAMPLE 14

Samples were prepared by the same method as that in Example 10, except that the thickness of the copper plate was 0.29 mm.

On the chip mounting portion of the metal circuit plate thus prepared, a chip was mounted via a high temperature solder, and the presence of displacement of the chip was verified. As a result, twenty samples had no displacement of the chip.

The results in Examples 1 through 14 and Comparative Examples 1 and 2 are shown in the following Table.

TABLE

| | Size of Bottom Face (mm) | Size of Top Face (mm) | Area of Top Face (mm²) | Ratio of Area (%) | Displaced Chips |
|---|---|---|---|---|---|
| Ex. 1 | 11.01 × 11.00 | 10.96 × 10.96 | 120.12 | 103 | 0/20 |
| Ex. 2 | 10.99 × 10.99 | 10.96 × 10.96 | 120.12 | 103 | 0/20 |
| Comp. 1 | 10.99 × 10.99 | 10.80 × 10.80 | 116.64 | 100 | 2/30 |
| Ex. 3 | 0.80 × 0.81 | 0.76 × 1.76 | 1.34 | 139 | 0/320 |
| Comp. 2 | 0.80 × 1.81 | 0.60 × 1.60 | 0.96 | 100 | 30/320 |
| Ex. 4 | 11.01 × 11.00 | 10.97 × 10.96 | 120.23 | 103 | 0/20 |
| Ex. 5 | 11.01 × 11.00 | 10.97 × 10.96 | 120.23 | 103 | 0/20 |
| Ex. 6 | 11.01 × 11.00 | 10.97 × 10.96 | 120.23 | 103 | 0/20 |
| Ex. 7 | 10.99 × 10.99 | 10.96 × 10.96 | 120.12 | 103 | 0/20 |
| Ex. 8 | 10.99 × 10.99 | 10.96 × 10.96 | 120.12 | 103 | 0/20 |
| Ex. 9 | 10.99 × 10.99 | 10.95 × 10.95 | 119.90 | 103 | 0/20 |
| Ex. 10 | 10.98 × 10.99 | 10.96 × 10.96 | 120.12 | 103 | 0/20 |
| Ex. 11 | 10.98 × 10.99 | 10.96 × 10.96 | 120.12 | 103 | 0/20 |
| Ex. 12 | 10.98 × 10.99 | 10.96 × 10.96 | 120.12 | 103 | 0/20 |
| Ex. 13 | 10.98 × 10.99 | 10.96 × 10.96 | 120.12 | 103 | 0/20 |
| Ex. 14 | 10.98 × 10.99 | 10.95 × 10.95 | 119.90 | 103 | 0/20 |

As described above, according to the present invention, the skirt spreading length of a metal plate is less than 50 μm, so that it is possible to realize a reliable chip mounting. In addition, the margin in design can be set even in the case of a smaller substrate. Furthermore, according to the present invention, it is possible to eliminate malfunction of a chip due to soldering by decreasing the skirt spreading length of a metal plate. Even if the skirt spreading length is changed by a small length of over ten micrometers, the ratio of the area of the top face of the metal plate before the change of the skirt spreading length to that after the change of the skirt spreading length is a large value, and the margin in design around a chip is very large when the chip is mounted, so that it is possible to greatly improve the reliability of the chip mounting and prevent the displacement of the chip.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A metal/ceramic circuit board comprising:

a ceramic substrate; and a metal circuit plate arranged on said ceramic substrate, said metal circuit plate having a thickness which is more than 0.25 mm and which is less than 0.3 mm, and said metal circuit plate having a skirt spreading length of less than 50 μm, said skirt spreading length being a distance between a plane perpendicular to a principal plane of said metal plate at one end of a bottom face of said metal plate and a plane perpendicular to a principal plane of said metal plate at one end of a top face of said metal plate on the same side as said one end of said bottom face of said metal plate assuming that said distance is positive when said bottom face has a greater area than that of said top face.

2. A metal/ceramic circuit board as set forth in claim 1, wherein said metal circuit plate is bonded directly to said ceramic substrate.

3. A metal/ceramic circuit board as set forth in claim 1, wherein said metal circuit plate is treated by nickel plating, nickel alloy plating, gold plating or preservation.

4. A metal/ceramic circuit board as set forth in claim 1, wherein said metal circuit plate is bonded to said ceramic substrate via a brazing filler metal.

5. A metal/ceramic circuit board as set forth in claim 4, wherein said brazing filler metal is made of a material selected from the group consisting of alloys and compounds containing Ag and an active metal, alloys and compounds containing Al, and mixtures thereof.

6. A metal/ceramic circuit board as set forth in claim 4, wherein said metal circuit plate and said brazing filler metal are treated by nickel plating, nickel alloy plating, gold plating or preservation.

7. A metal/ceramic circuit board as set forth in claim 1, wherein said ceramic substrate is formed of a material selected from the group consisting of oxides, nitrides and carbides.

8. A metal/ceramic circuit board as set forth in claim 1, wherein said metal circuit plate is formed of a material selected from the group consisting of copper, aluminum, and alloys thereof.

9. A metal/ceramic circuit board as set forth in claim 1, which is a metal/ceramic circuit board on which a super power element is mounted.

10. A metal/ceramic circuit board as set forth in claim 1, which is a metal/ceramic circuit board having a fine pattern on which a Peltier element or a high frequency circuit is mounted.

11. A module assembled by using a metal/ceramic circuit board as set forth in claim 1.

* * * * *